United States Patent

Tsukude

[11] Patent Number: 5,831,921
[45] Date of Patent: Nov. 3, 1998

[54] SEMICONDUCTOR MEMORY DEVICE HAVING SIGNAL GENERATING CIRCUITRY FOR SEQUENTIALLY REFRESHING MEMORY CELLS IN EACH MEMORY CELL BLOCK IN A SELF-REFRESH MODE

[75] Inventor: Masaki Tsukude, Hyogo, Japan

[73] Assignee: Mitsubishi Denki Kabushiki Kaisha, Tokyo, Japan

[21] Appl. No.: 895,064

[22] Filed: Jul. 16, 1997

Related U.S. Application Data

[63] Continuation of Ser. No. 658,192, Jun. 4, 1996, abandoned.

[30] Foreign Application Priority Data

Dec. 11, 1995 [JP] Japan .................................. 7-321656

[51] Int. Cl.$^6$ ........................................................ G11C 7/00
[52] U.S. Cl. .................... 365/222; 365/230.04; 365/240; 365/230.06; 365/236
[58] Field of Search ............................... 365/222, 230.04, 365/240, 230.06, 236

[56] References Cited

U.S. PATENT DOCUMENTS 5,568,440 10/1996 Tsukude et al. ........................ 365/222

OTHER PUBLICATIONS

"A 256M Dram with Simplified Register Control for Low Power Self Refresh and Rapid Burn–in" by Seung–Moon Yoo et al., 1994 Symposium on VLSI Circuits Digest of Technical Papers, pp. 85–86.

*Primary Examiner*—David C. Nelms
*Assistant Examiner*—Andrew Q. Tran
*Attorney, Agent, or Firm*—McDermott, Will & Emery

[57] ABSTRACT

In a DRAM, an upper address is assigned to each of ways W0 and W1, and a lower address is assigned to each word line WL in each of ways W0 and W1. A self-refresh start trigger generating circuit senses start of self-refresh, and a refresh address change sensing circuit senses change in an upper address. Based on the result of sensing, way selection signals RX0 and RX1 will not be reset and held at an active level while ways W0 and W1 are selected, respectively. Consequently, power consumption can be reduced compared to a conventional example in which signals RX0 and RX1 are reset every time a single word line WL is selected.

12 Claims, 15 Drawing Sheets

SEMICONDUCTOR MEMORY DEVICE HAVING SIGNAL GENERATING CIRCUITRY FOR SEQUENTIALLY REFRESHING MEMORY CELLS IN EACH MEMORY CELL BLOCK IN A SELF-REFRESH MODE

This application is a continuation of application Ser. No. 08/658,192 filed Jun. 4. 1996 now abandoned.

BACKGROUND OF THE INVENTION

1. Field of the Invention

The present invention relates to a semiconductor memory device. More particularly, the present invention relates to a semiconductor memory device having a self-refresh mode.

2. Description of the Background Art

FIG. 16 is a block diagram showing a structure of a conventional dynamic random access memory (hereinafter referred to as DRAM) having a self-refresh mode.

Referring to FIG. 16, this DRAM is provided with control signal input terminals 30–32 and 34, an address signal input terminal group 33, a data signal I/O terminal group 35, a ground terminal 36, and a power supply terminal 37. This DRAM is further provided with a clock generating circuit 38, a row and column address buffer 39, an address switching circuit 40, an address generating circuit 41, a row decoder 42, a column decoder 43, a memory mat 44, an input buffer 47, and an output buffer 48, and memory mat 44 includes a memory array 45 and a sense refresh amplifier+I/O control circuit 46.

Clock generating circuit 38 selects a prescribed operation mode based on signals ext/RAS and ext/CAS externally applied through control signal input terminals 30 and 31, respectively, and controls the entire DRAM. Row and column address buffer 39 selectively applies address signals A0-Aq (where q is a natural number) which are applied externally through address signal input terminal group 33 to row decoder 42 and column decoder 43 at the time of read and write operations.

Address generating circuit 41 includes an oscillator 49 and an address counter 50, as shown in FIG. 17. Oscillator 49 is activated by a self-refresh instruction signal SREFE output from clock generating circuit 38, and outputs an internal clock signal int/RAS. Address counter 50 includes a plurality of flipflops FF0-FFq which are connected in series to each other, and counts the number of pulses of the internal clock signal int/RAS output from oscillator 49. Outputs of flipflops FF0-FFq are address signals C0-Cq for self-refresh, respectively. Address switching circuit 40 is controlled by a self-refresh instruction signal SREFE, couples row and column address buffer 39 and row decoder 42 to each other at the time of read and write operations, and couples address generating circuit 41 and row decoder 42 to each other at the time of self-refresh operation.

Memory array 45 has storage capacity of 64 Mbits, for example. 1-bit data is stored in a single memory cell. Each memory cell is located at a prescribed address determined by a row address and a column address.

Row decoder 42 designates a row address of memory array 45 in response to an address signal applied from row and column address buffer 39 or address generating circuit 41. Column decoder 43 designates a column address of memory array 45 in response to an address signal applied from row and column address buffer 39.

Sense refresh amplifier+I/O control circuit 46 connects a memory cell at an address designated by row decoder 42 and a column decoder 43 to one end of a global signal I/O line pair GIO at the time of read and write operations. In addition, sense refresh amplifier+I/O control circuit 46 refreshes data in a memory cell at a row address designated by row decoder 42 at the time of self-refresh operation.

The other end of the global signal I/O line pair GIO is connected to input buffer 47 and output buffer 48. Input buffer 47 applies data input from data signal I/O terminal group 35 through the global signal I/O line pair GIO to a selected memory cell in response to a signal ext/W applied externally thorough control signal input terminal 32, at the time of the write operation. Output buffer 48 outputs read data from a selected memory cell to data signal I/O terminal group 35 in response to a signal ext/OE input from control signal input terminal 34, at the time of the read operation.

FIG. 18 is a diagram showing layout of row decoder 42 and memory mat 44 of the DRAM shown in FIG. 16. Referring to FIG. 18, a so-called alternate shared sense amplifier method is used in this DRAM. More specifically, memory array 45 is divided into a plurality of memory array blocks BK1-BKm (where m is a natural number), sense refresh amplifier+I/O control circuit 46 is divided into a plurality of sense amplifier bands SA0-SAm, and memory array blocks BK1-BKm are respectively located between every two of sense amplifier bands SA0-SAm.

Sense amplifier band SA0 is provided with a plurality of sense refresh amplifiers 51 corresponding to, for example, even columns of adjacent memory array block BK1, respectively. Sense amplifier band SA1 is provided with a plurality of sense refresh amplifiers 51 corresponding to, for example, odd columns of adjacent memory array blocks BK1 and BK2. Sense refresh amplifiers 51 of sense amplifier band SA1 are shared by memory array blocks BK1 and BK2. For which one of memory array blocks BK1 and BK2 sense refresh amplifiers 51 of sense amplifier band SA1 are used is determined by signals BLIL1 and BLIR1 input from row decoder 42. The same is applied to another sense amplifier band SA2-SAm.

In addition, row decoder 42 includes a plurality of word driver groups WD1-WDm. Word driver groups WD1-WDm are provided corresponding to memory array blocks BK1-BKm, respectively. Word driver group WD1 selects any one row of memory array block BK1 in response to a signal group X and signals RX0-1 and RX1-1. Signal group X is a signal group produced within row decoder 42 based on externally applied address signals A1–A7 or address signals C1–C7 applied from address generating circuit 41. Signals RX0-1 and RX1-1 are signals produced within row decoder 42 based on address signals A0 and A8-Aq or address signals C0 and C8-Cq. The same is applied to another word driver group WD2-WDm.

FIG. 19 is a block diagram partially showing a structure of memory array block BK1 of FIG. 18 and the periphery thereof. Referring to FIG. 19, memory array block BK1 includes a plurality of memory cells MCs arranged in rows and columns, a word line WL provided corresponding to each row, and a bit line pair BLP provided corresponding to each column. A memory cell MC includes an access MOS transistor Q and an information storage capacitor C. A word line WL transmits an output of word driver group WD1 and activates a memory cell MC at a selected row. A bit line pair BLP include bit lines BL and /BL through which complementary signals are transmit, respectively, and input and output a data signal to and from a selected memory cell MC.

A bit line pair BLP in an odd column of memory array block BK1 is connected through a transfer gate 61 to a sense refresh amplifier 51, and is further connected through a transfer gate 64 to a bit line pair BLP in an odd column of memory array block BK2. Transfer gate 61 includes N channel MOS transistors 62 and 63 respectively connected between a bit line BL and an I/O node N1 of sense refresh amplifier 51 and between a bit line /BL and an I/O node N2 thereof. N channel MOS transistors 62 and 63 have their gates receiving a signal BLIL1. Transfer gate 64 includes N channel MOS transistors 65 and 66 respectively connected between bit line BL and I/O node N1 of sense refresh amplifier 51 and between bit line /BL and I/O node N2 of sense refresh amplifier 51. N channel MOS transistors 65 and 66 have their gates receiving a signal BLIR1. Transfer gates 61 and 64 connect a selected memory array block (BK1, for example) out of memory array blocks BK1 and BK2 and sense refresh amplifier 51 to each other, and disconnect the other memory array block (BK2, in this case) and sense refresh amplifier 51 from each other.

Sense refresh amplifier 51 includes N channel MOS transistors 52 and 53 respectively connected between I/O node N1 and a node N3 and between I/O node N2 and node N3, and P channel MOS transistors 55 and 56 respectively connected between I/O node N1 and a node N4 and between I/O node N2 and node N4. MOS transistors 52 and 55 have their gates connected to I/O node N2, and MOS transistors 53 and 56 have their gates connected to I/O node N1. In addition, sense refresh amplifier 51 includes an N channel MOS transistor 54 connected between node N3 and a node of ground potential GND, and a P channel MOS transistor 57 connected between node N4 and a node of power supply potential Vcc. MOS transistors 54 and 57 have their gates receiving sense amplifier activation signals SANE and SAPE, respectively. Sense refresh amplifier 51 amplifies small potential difference produced between bit lines BL and /BL after a memory cell MC is selected.

Furthermore, a bit line equalize circuit 70 for equalizing respective potentials of bit lines BL and /BL to bit lint potential Vcc/2 before a memory cell MC is selected is provided between transfer gates 61 and 64. Bit line equalize circuit 70 includes N channel MOS transistors 71 and 72 respectively connected between I/O node N1 of sense amplifier 51 and a node N5 and between I/O node N2 of sense amplifier 51 and node N5, and an N channel MOS transistor 73 connected between I/O nodes N1 and N2. MOS transistors 71–73 have their gates receiving a bit line equalize signal BLEQ. Bit line potential Vcc/2 is applied to node N5.

In addition, a 2-way method is used in this DRAM. A plurality of word lines WLs in memory array block BK1 are divided into two ways W0 and W1. Way W0 includes a word line WL in an odd row, and way W1 includes a word line WL in an even row. Signals RX0-1 and RX1-1 are respectively assigned to ways W0 and W1 of memory array block BK1, and signal group X is assigned to respective word lines WLs of ways W0 and W1. Each word line WL in memory array block BK1 is specified by signals RX0-1 and RX1-1 and signal group X.

In order to realize this 2-way method, word driver group WD1 includes a word driver (AND gate) 80 provided corresponding to each odd row of memory array block BK1, a word driver (AND gate) 81 provided corresponding to each even row thereof, and a word driver (AND gate) 82 provided corresponding to each pair of adjacent word drivers 80 and 81. Word driver 82 receives signal group X. Word driver 80 receives an output of word driver 82 and a signal RX0-1. Word driver 81 receives an output of word driver 82 and a signal RX1-1. Outputs of word drivers 80 and 81 are respectively applied to corresponding word lines WLs. For example, if all signals of the signal group X attain an active level of an "H" level and a signal RX0-1 for selecting way W0 attains an active level of an "H" level, the first word line WL1 is selected. The same is applied to another memory array block BK2-BKm.

The operation of the DRAM shown in FIGS. 16 to 19 will now be described briefly. In the write operation, a bit line pair BLP in a column corresponding to an address signal is selected by column decoder 43, and the selected bit line pair BLP is connected to input buffer 47 through sense refresh amplifier+I/O control circuit 46 and global signal I/O line pair GIO. Input buffer 47 applies write data from data signal I/O terminal group 35 to the selected bit line pair BLP through global signal I/O line pair GIO in response to a signal ext/W. The write data is applied as a potential difference between bit lines BL and /BL. Then, row decoder 42 causes a word line WL in a row corresponding to an address signal to rise to an active level of an "H" level, and renders an MOS transistor Q of a memory cell MC in that row conductive. Charges corresponding to potential of bit line BL or /BL are stored in a capacitor C of the selected memory cell MC.

Charges in capacitor C of the memory cell MC flow out gradually, so that data refresh is carried out. FIG. 20 is a timing chart illustrating the self-refresh operation. Clock generating circuits 38 outputs a self-refresh instruction signal SREFE if it detects the fact that a signal ext/RAS falls after the fall of a signal ext/CAS and that the signal ext/RAS is held in that condition for 100 $\mu$s or more.

Address switching circuit 40 couples address generating circuit 41 and row decoder 42 to each other in response to output of the self-refresh instruction signal SREFE from clock generating circuit 38. Furthermore, oscillator 49 of address generating circuit 41 initiates oscillation and outputs an internal clock signal int/RAS. Address counter 50 counts the number of pulses of the internal clock signal int/RAS, and outputs address signals C0-Cq.

In FIG. 19, if the address signals C0-Cq are signals for designating one word line WL in memory array block BK1, for example, signals BLIR1 and BLEQ fall from an "H" level to an "L" level in response to the fall of the internal clock signal int/RAS, and MOS transistor 65 and 66 of transfer gate 64 and MOS transistors 71–73 of bit line equalize circuit 70 are rendered non-conductive. Row decoder 42 causes a word line WL in a row corresponding to the address signals C0-Cq to rise to an "H" level. Potentials of bit lines BL and /BL change slightly according to an amount of charges in a capacitor C of an activated memory cell MC.

Then, a sense amplifier activation signal SANE is made to rise an "H" level and a sense amplifier activation signal SAPE is made to fall to an "L" level, whereby sense refresh amplifier 51 is activated. If potential of bit line BL is slightly higher than that of bit line /BL, respective resistance values of MOS transistors 53 and 55 are lower than those of MOS transistors 52 and 56, so that potential of bit line BL is pulled up to an "H" level and potential of bit line /BL is pulled down to an "L" level. On the contrary, if potential of bit line /BL is slightly higher than that of bit line BL, respective resistance values of MOS transistors 52 and 56 are lower than those of MOS transistors 53 and 55, so that potential of bit line /BL is pulled up to an "H" level and potential of bit line BL is pulled down to an "L" level.

If the signal int/RAS rises to an "H" level, word line WL is made to fall to an inactive level of an "L" level, and signals BLIR1, BLEQ, SANE, and SAPE are reset, whereby data refresh for that word line WL is finished.

Such a cycle as described above is carried out for each word line WL of memory array block BK1, and is next carried out for each word line WL of memory array block BK2. When signals ext/RAS and ext/CAS attain an "H" level and output of a self-refresh instruction signal SREFE is stopped, a self-refresh mode is finished.

In the read operation, data in memory cells MCs of a row selected by row decoder 42 are respectively read onto bit line pairs BLPs in a manner similar to that in the refresh operation, and data of a bit line pair BLP in a column selected by column decoder 43 is applied to output buffer 48 through global signal I/O line pair GIO. Output buffer 48 outputs read data to data signal I/O terminal group 35 in response to a signal ext/OE.

However, there are problems as follows in the conventional DRAM. More specifically, provided that the number of word lines WLs in each of memory array blocks BK1-BKm is n (where n is a natural number), a signal BLIR1, for example, swings k times (where $k \leq n$) while memory array block BK1 is selected, and signals BLIL1 and BLIR2 swing n times while memory array block BK2 is selected. Furthermore, signals RX0-1 and RX1-1 swing k/2 times while memory array block BK1 is selected, and signals RX0-2 and RX1-2 swing n/2 times while memory array block BL2 is selected.

An "H" level of these signals BL1 and RX is set to boosted potential Vpp which is higher than power supply potential Vcc, in order to make respective potentials of bit lines BL and /BL swing completely. Although a charge pumping circuit is used to produce this boosted potential Vpp, pumping efficiency of this charge pumping circuit is low such as about 30 to 40%, and therefore, large power which is several times that required to make signals BL1 and RX swing has been necessary in order to retain the boosted potential vpp stably.

SUMMARY OF THE INVENTION

It is therefore a primary object of the present invention to provide a semiconductor memory device with small power consumption.

In a semiconductor memory device in accordance with one aspect of the present invention, a plurality of word lines are divided into a plurality of groups, and in a self-refresh mode, an upper address is assigned to each group and a lower address is assigned to each word line belonging to each group. A first signal generating circuit is provided corresponding to each upper address, and a second signal generating circuit is provided corresponding to each lower address. The first and the second signal generating circuits respectively output a group selection signal and a word line selection signal while an address designating circuit designates a corresponding address. Since the group selection signal will not be reset while the same upper address is designated, reduction in power consumption can be achieved compared to a conventional example in which the group selection signal is reset every time a lower address designated is changed.

In a semiconductor memory device in accordance with another aspect of the present invention, a memory array is divided into a plurality of blocks, and in a self-refresh mode, a lower address is assigned to each block and an upper address is assigned to each word line of each block. A first signal generating circuit is provided corresponding to each upper address, and a second signal generating circuit is provided corresponding to each lower address. The first and the second signal generating circuits respectively output a word line selection signal and a block selection signal while an address designating circuit designates a corresponding address. Since the word line selection signal will not be reset while the same upper address is designated, reduction in power consumption can be achieved compared to a conventional example in which the word line selection signal is reset every time a lower address designated is changed.

In a semiconductor memory device in accordance with a further aspect of the present invention, a memory array is divided into a plurality of blocks, refresh executing circuits are provided between every two of the plurality of blocks, respectively, and a connecting circuit is provided corresponding to each block. The connecting circuit connects a corresponding block to a corresponding refresh executing circuit and disconnects that refresh executing circuit from another block while an address designating circuit designates a corresponding block. Consequently, reduction in power consumption can be achieved compared to a conventional example in which a connecting circuit is reset every time a word line designated by an address designating circuit is changed.

Preferably, the address designating circuit includes a clock generating circuit, a first counter, and a second counter. The clock generating circuit outputs a clock signal in response to setting of a self-refresh mode. The first counter counts the number of pulses of the clock signal output from the clock generating circuit, and sequentially designates a lower address according to the resultant count value. The second counter counts the number of times for the first counter to count up, and sequentially designates an upper address according to the resultant count value. Thus, the address designating circuit can be structured easily.

More preferably, the first signal generating circuit includes a first pulse generating circuit, a second pulse generating circuit, a flipflop, and an output circuit.

The first pulse generating circuit outputs a first pulse signal in response to setting of a self-refresh mode. The second pulse generating circuit outputs a second pulse signal in response to change in a count value of the second counter. The flipflop is set by the first and the second pulse signals respectively output from the first and the second pulse generating circuits, and is reset by the clock signal output from the clock generating circuit. The output circuit outputs a prescribed selection signal in response to both start of designation of a corresponding upper address by the second counter and reset of the flipflop, and discontinues output of the selection signal in response to set of the flipflop. Thus, the first signal generating circuit can be structured easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
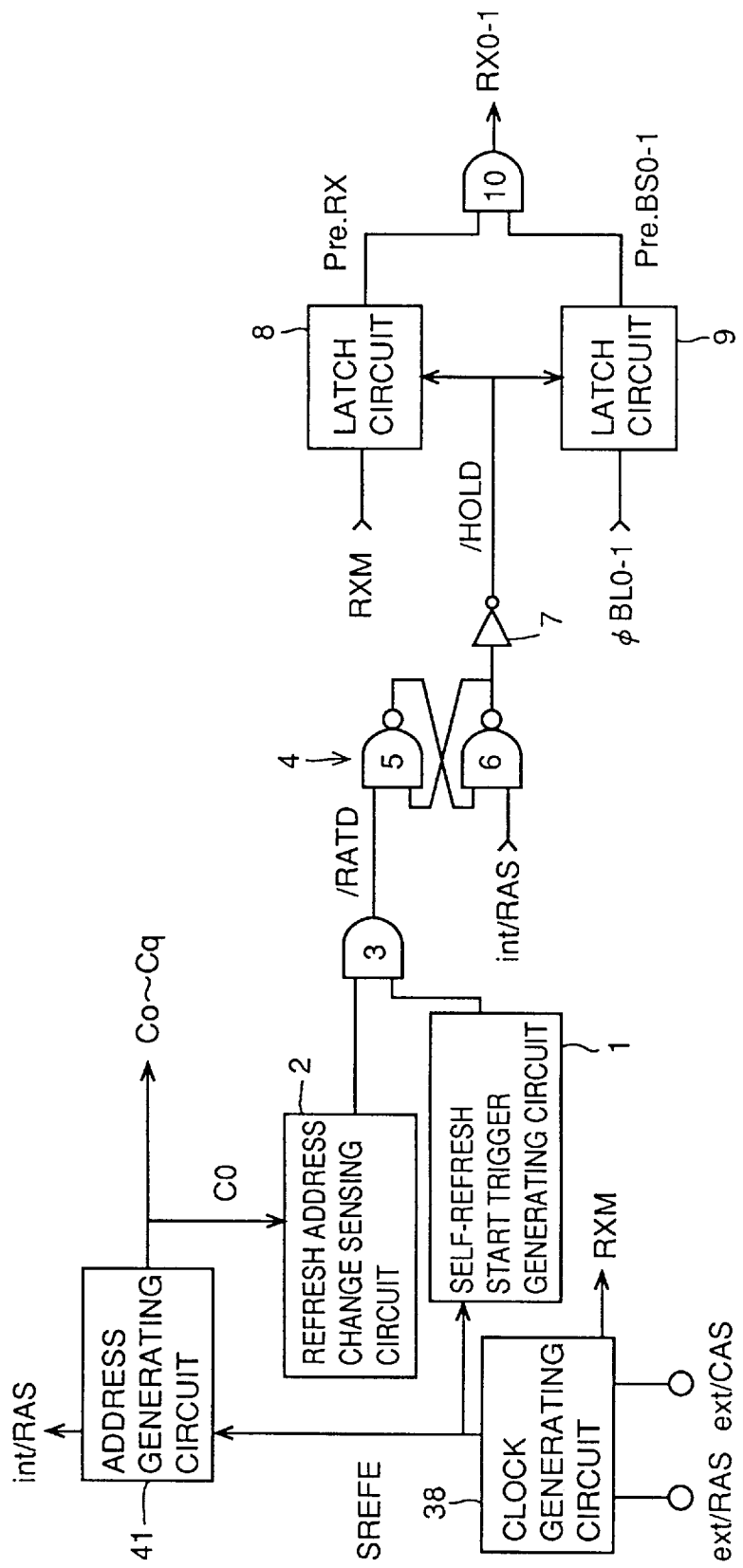
FIG. 1 is a block diagram showing a structure of a main part of a DRAM in accordance with a first embodiment of the present invention.
Figure 2:
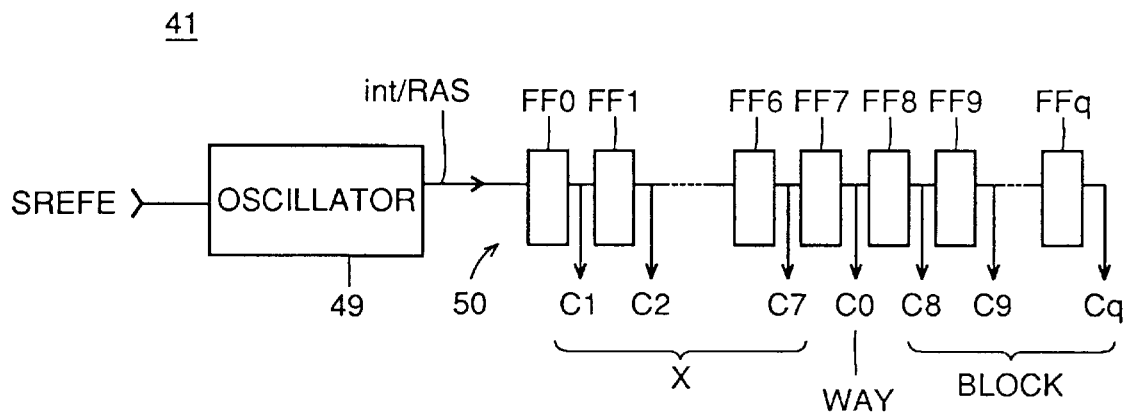
FIG. 2 is a block diagram partially showing a structure of an address generating circuit shown in FIG. 1.

FIG. 1 is a block diagram showing a structure of a main part of a DRAM in accordance with a first embodiment of the present invention, and FIG. 2 is a block diagram showing a structure of an address generating circuit 41.

Referring to FIGS. 1 and 2, this DRAM is different from a conventional DRAM in that a row decoder 42 is additionally provided with a self-refresh start trigger generating circuit 1, a refresh address change sensing circuit 2, AND gates 3 and 10, a flipflop 4, and latch circuits 8 and 9, in that an address signal C0 is output from a flipflop FF7 of address generating circuit 41, and in that address signals Cl–C7 are respectively output from flipflops FF0-FF6 of address generating circuit 41.

Self-refresh start trigger generating circuit 1 normally outputs a signal at an "H" level, and outputs a pulse at an "L" level in response to output of a self-refresh instruction signal SREFE from a clock generating circuit 38. Refresh-address change sensing circuit 2 normally outputs a signal at an "H" level, and outputs a pulse at an "L" level in response to change in an address signal C0, that is, an output of flipflop FF7 in address generating circuit 41. AND gate 3 outputs a logical product signal /RATD of an output signal of self-refresh start trigger generating circuit 1 and an output signal of refresh address change sensing circuit 2.

Flipflop 4 includes two NAND gates 5 and 6 and an inverter 7. Flipflop 4 is set by a signal /RATD, is reset by an internal clock signal int/RAS output from an oscillator 49 of address generating circuit 41. An output of flipflop 4 is a signal /HOLD.

Figure 3:
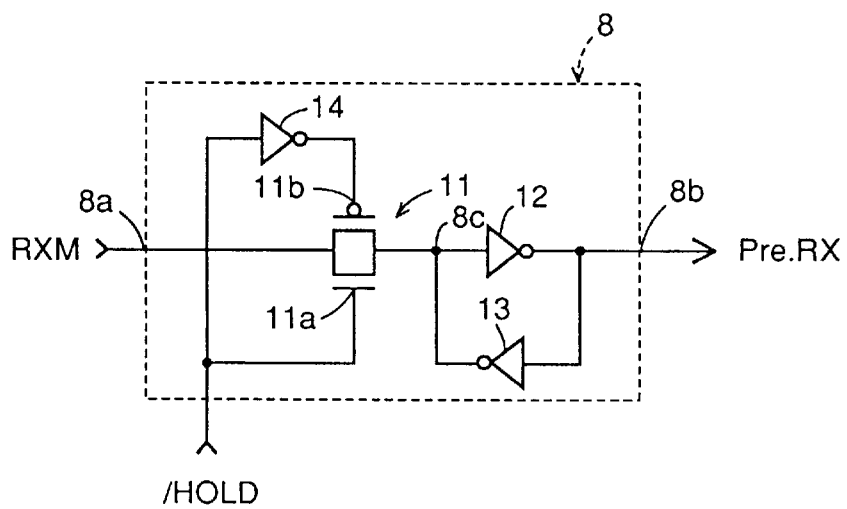
FIG. 3 is a block diagram showing a structure of a latch circuit shown in FIG. 1.

Latch circuit 8 includes a transfer gate 11 and inverters 12–14 as shown in FIG. 3. Transfer gate 11 is connected between an input node 8a and an intermediate node 8c, inverter 12 is connected between intermediate node 8c and an output node 8b, and inverter 13 is connected between output node 8b and intermediate node 8c. A signal /HOLD is directly input to a gate 11a on the side of an N channel MOS transistor of transfer gate 11, as well as input through inverter 14 to a gate 11b on the side of a P channel MOS transistor of transfer gate 11. Accordingly, an input level at the time when the signal /HOLD falls from an "H" level to an "L" level is latched by inverters 12 and 13. Latch circuit 9 has a structure similar to that of latch circuit 8. A signal RXM is input to latch circuit 8, while a signal ΦBL0-1 is input to latch circuit 9.

AND gate 10 receives respective output signals Pre.RX and Pre.BS0-1 of latch circuits 8 and 9. An output of AND gate 10 is a signal RX0-l. Latch circuit 9 and AND gate 10 are provided corresponding to each pair of signals RX01, RX1-1 to RX0-m, RX1-m.

Figure 4:
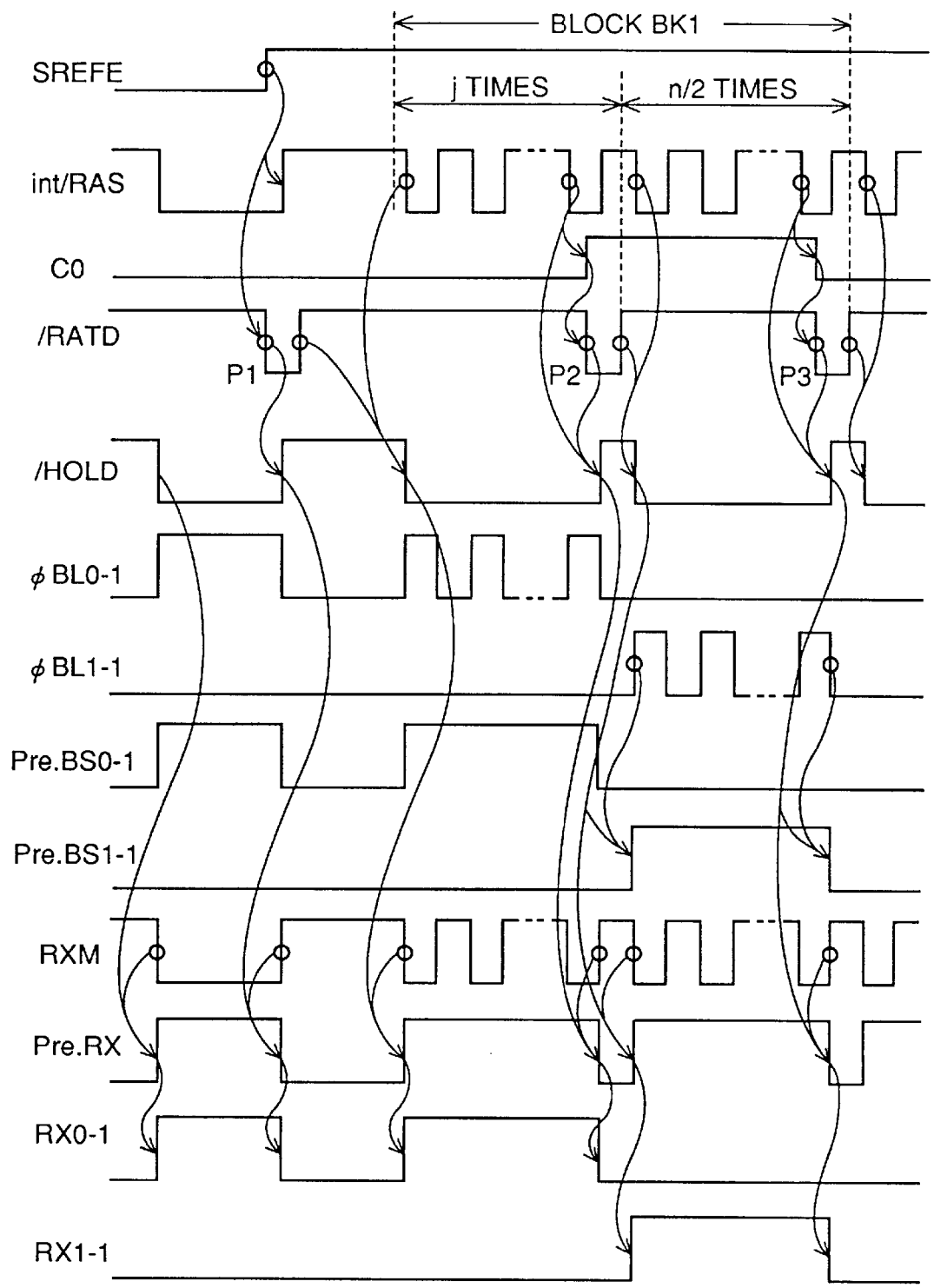
FIG. 4 is a timing chart illustrating the operation of the DRAM shown in FIG. 1.

FIG. 4 is a timing chart illustrating the operation of the DRAM shown in FIGS. 1 to 3. When a self-refresh instruction signal SREFE is output from clock generating circuit 38, an internal clock signal int/RAS is output from oscillator 49 of the address generating circuit 41, so that counting operation of an address counter 50 is initiated.

A pulse signal P1 at an "L" level is output from self-refresh start trigger generating circuit 1 in response to output of the self-refresh instruction signal SREFE, and pulse signals P2, P3, . . . at an "L" level are output from refresh address change sensing circuit 2 in response to change in an address signal C0, that is, an output of flipflop FF7 of address generating circuit 41. The pulse signals P1, P2, P3, . . . pass through AND gate 3 to be a signal /RATD.

Flipflop 4 is set by fall of the signal /RATD to an "L" level, and is reset by fall of the internal clock signal int/RAS to an "L" level. An output of flipflop 4 is a signal /HOLD.

Signals ΦBL0-1 and ΦBL1-1 are signals generated within row decoder 42 based on the internal clock signal int/RAS and respective outputs C0 and C8-Cq of flipflops FF7-FFq of address generating circuit 41. The signal ΦBL0-1 is a signal indicating that one way W0 of a memory array block BK1 is selected, and is an inverted signal of the internal clock signal int/RAS for a period during which way W0 of block BK1 is selected. The signal ΦBL1-1 is a signal indicating that the other way W1 of memory array block BK1 is selected, and is an inverted signal of the internal clock signal int/RAS for a period during which way W1 of block BK1 is selected.

The signal ΦBL0-1 is latched by latch circuit 9 when the signal /HOLD falls from an "H" level to an "L" level, and is unlatched from latch circuit 9 when the signal /HOLD rises from an "L" level to an "H" level. An output of latch circuit 9 is a signal Pre.BS0-1. The signal ΦBL1-1 will be a signal Pre.BS1-1 in a manner similar to that described above. Thus, for each of the signals ΦBL0-1 and ΦBS1-1, a portion which swings at the same period that of the internal clock signal int/RAS is made constant at an "H" level.

Figure 19:
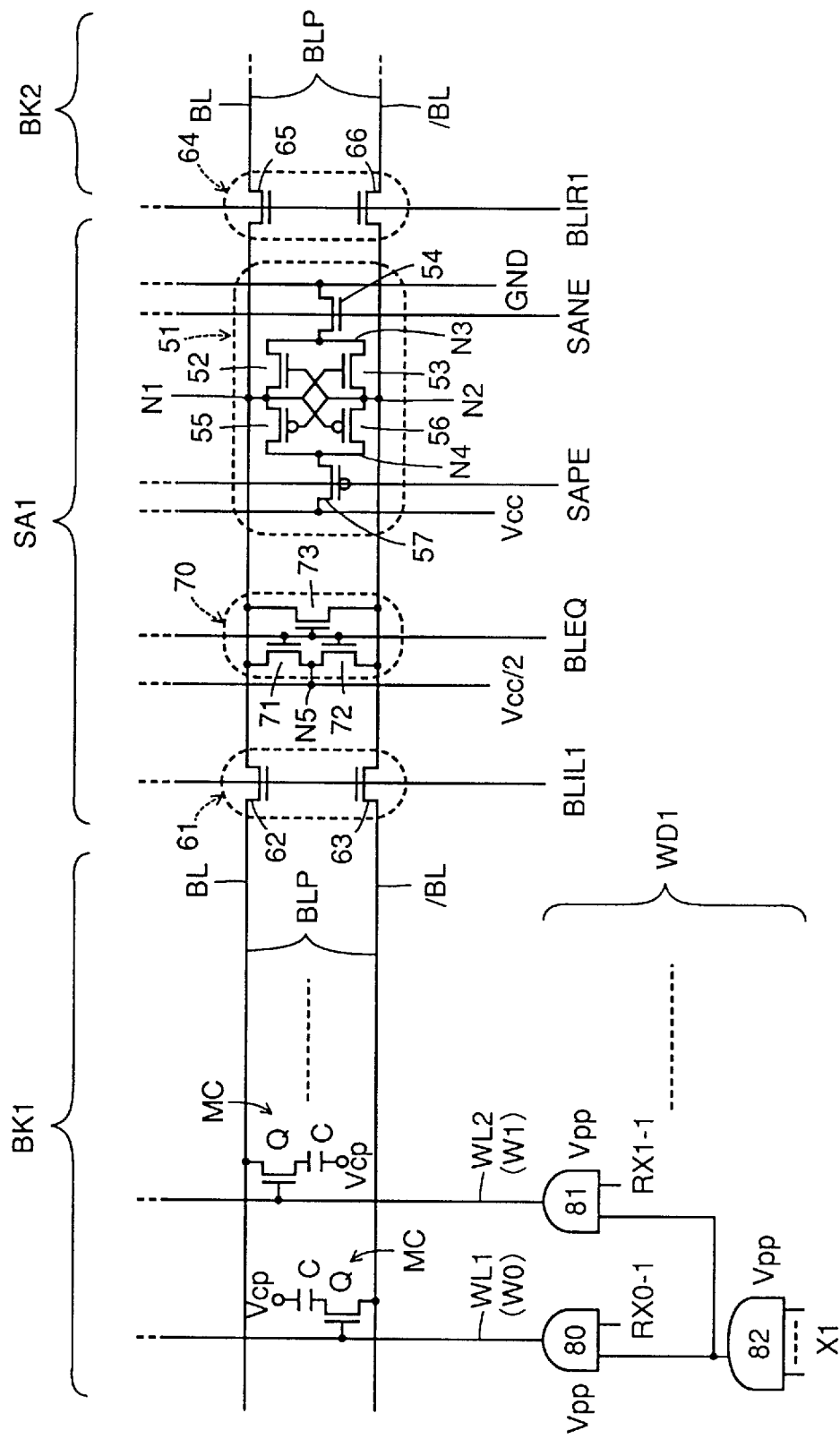
FIG. 19 is a block diagram partially showing a structure of both a memory array block shown in FIG. 18 and the periphery thereof.
Figure 20:
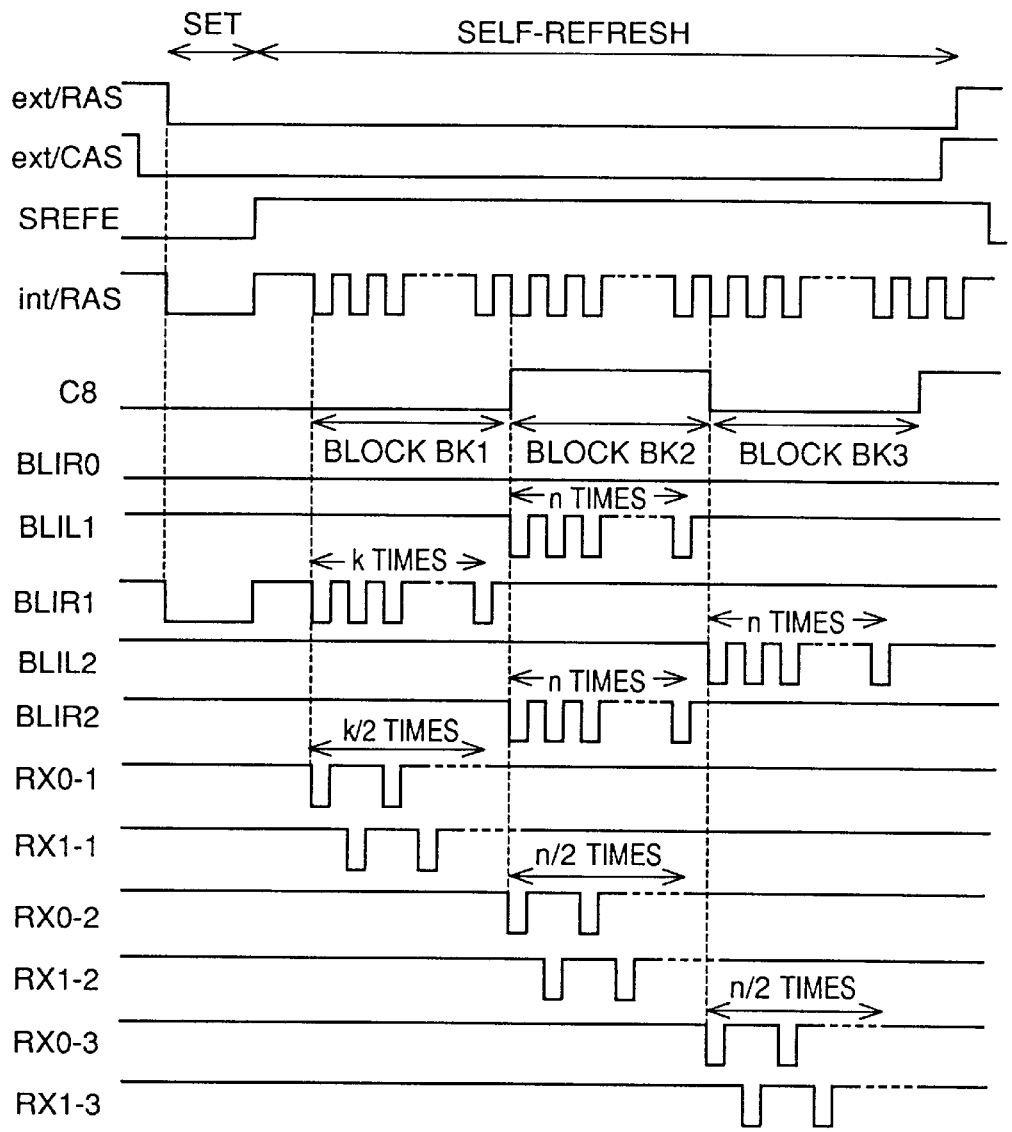
FIG. 20 is a timing chart illustrating self-refresh operation of the DRAM shown in FIG. 16.

A signal RXM is a signal which swings at approximately the same timing as that of the internal clock signal int/RAS, and is output from clock generating circuit 38. The signal RXM is latched by latch circuit 8 when the signal /HOLD falls from an "H" level to an "L" level, and is unlatched from latch circuit 8 when the signal /HOLD rises from an "L" level to an "H" level. An output of latch circuit 8 is a signal Pre.RX. A logical product signal of the signals Pre.RX and Pre.BS0-1 is a signal RX0-1, and a logical product signal of the signals Pre.RX and Pre.BS1-1 is a signal RX1-1. Word drivers 80 and 81 of FIG. 19 are activated by these signals RX0-1 and RX1-1, respectively.

While word driver 80 of way W0 is activated by the signal RX0-l, word lines WLs belonging to way W0 are sequentially selected, so that data refresh is performed. In addition, while word driver 81 of way W1 is activated by the signal RX1-1, word lines WLs belonging to way W1 are sequentially selected, so that data refresh is performed. Then, a block BK2 is selected, and operation similar to that described above is carried out.

In the first embodiment, an upper address is assigned to each of ways W0 and W1 and a lower address is assigned to each word line WL belonging to ways W0 and W1. Furthermore, while a word line WL in one way W (W0, for example) of one block BK (Bk1, for example) is selected, a signal RX (RX0-1, in this case) is retained at an active level, that is, an "H" level without being reset. Consequently, power consumption is reduced compared to the conventional example in which a signal RX is reset every time one word line WL is selected. More specifically, since a signal RX needs to be reset only once for a period during which n/2 word lines WLs are selected (only once for j word lines WLs (where j<n/2) in the case of the first selected way W0), power required to reset a signal RX is reduced to about 2/n compared to the conventional example. Since the number of word lines WLs per one block BK is normally 256 or 512, power consumption will be reduced to one-several hundredths.

Although the number of ways is 2 in the first embodiment, the same effects can be obtained of course with three ways or more.

In addition, word drivers 80–82 may be constituted by CMOS transistors, or may be constituted by N channel MOS transistors.

Second Embodiment

Figure 5:
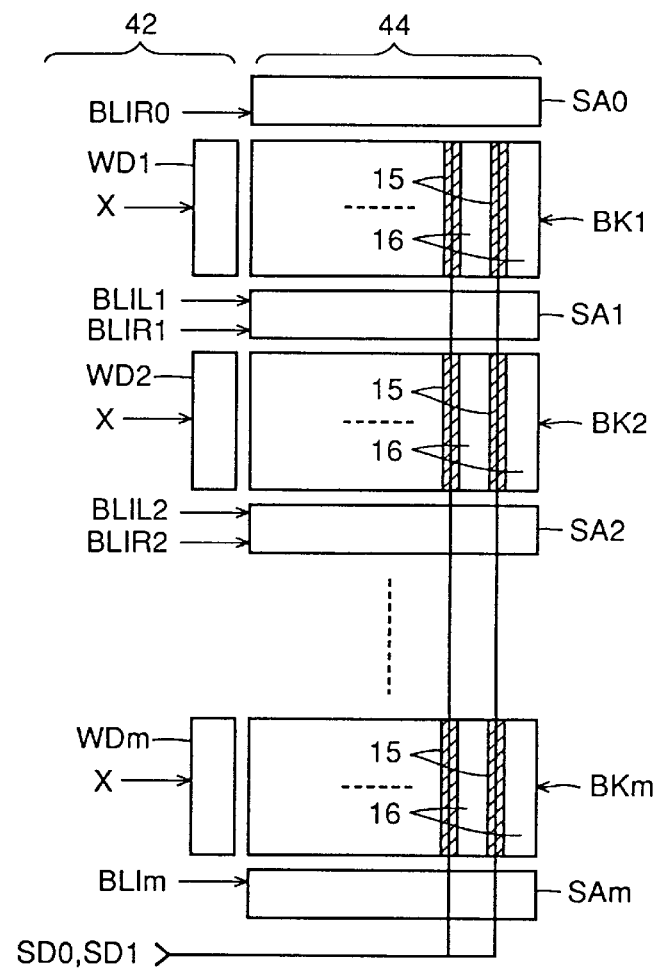
FIG. 5 is a diagram showing layout of a row decoder and a memory mat of a DRAM in accordance with a second embodiment of the present invention.
Figure 6:
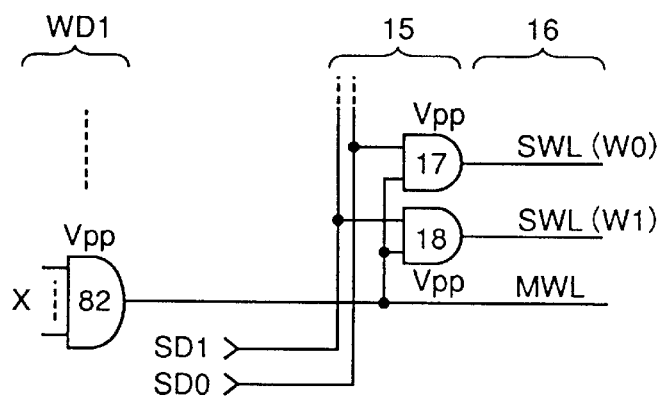
FIG. 6 is a block diagram partially showing a structure of a main part of the row decoder and the memory mat shown in FIG. 5.

FIG. 5 is a diagram showing layout of a row decoder 42 and a memory mat 44 of a DRAM in accordance with a second embodiment of the present invention, and FIG. 6 is an enlarged view showing a main part of FIG. 5.

Referring to FIGS. 5 and 6, a divided word line method and a two-way method are used in this DRAM. Each word line WL in each of memory array blocks BK1-BKm is divided into a plurality of sub-word lines SWLs, each of memory array blocks BK1-BKm is divided into a plurality of sub-blocks 16, and a SD band 15 is provided corresponding to each sub-block 16.

A plurality of sub-word lines SWLs of each sub-block 16 are divided into two ways W0 and W1. Way W0 includes a sub-word line SWL in an odd row, and way W1 includes a sub-word line SWL in an even row. Signals SD0 and SD1 are assigned to ways W0 and W1, and a signal group X is assigned to each sub-word line SWL belonging to ways W0 and W1. Each sub-word line SWL of each sub-block 16 is specified by signals SD0 and SD1 and signal group X.

In order to realize a two-way method, each SD band includes a word driver 17 provided corresponding to each odd row of a corresponding sub-block 16, and a word driver 18 provided corresponding to each even row of a corresponding sub-block 16. In addition, each of word driver groups WD1-WDm includes a word driver 82 provided corresponding to adjacent word drivers 17 and 18 of SD band 16 of corresponding one of memory array blocks BK1-BKm. Word driver 82 receives a signal group X. Word driver 17 receives an output of word driver 82 and a signal SD0. Word driver 18 receives an output of word driver 82 and a signal SD1. Outputs of word drivers 17 and 18 are respectively applied to corresponding sub-word lines SWLs.

Figure 7:
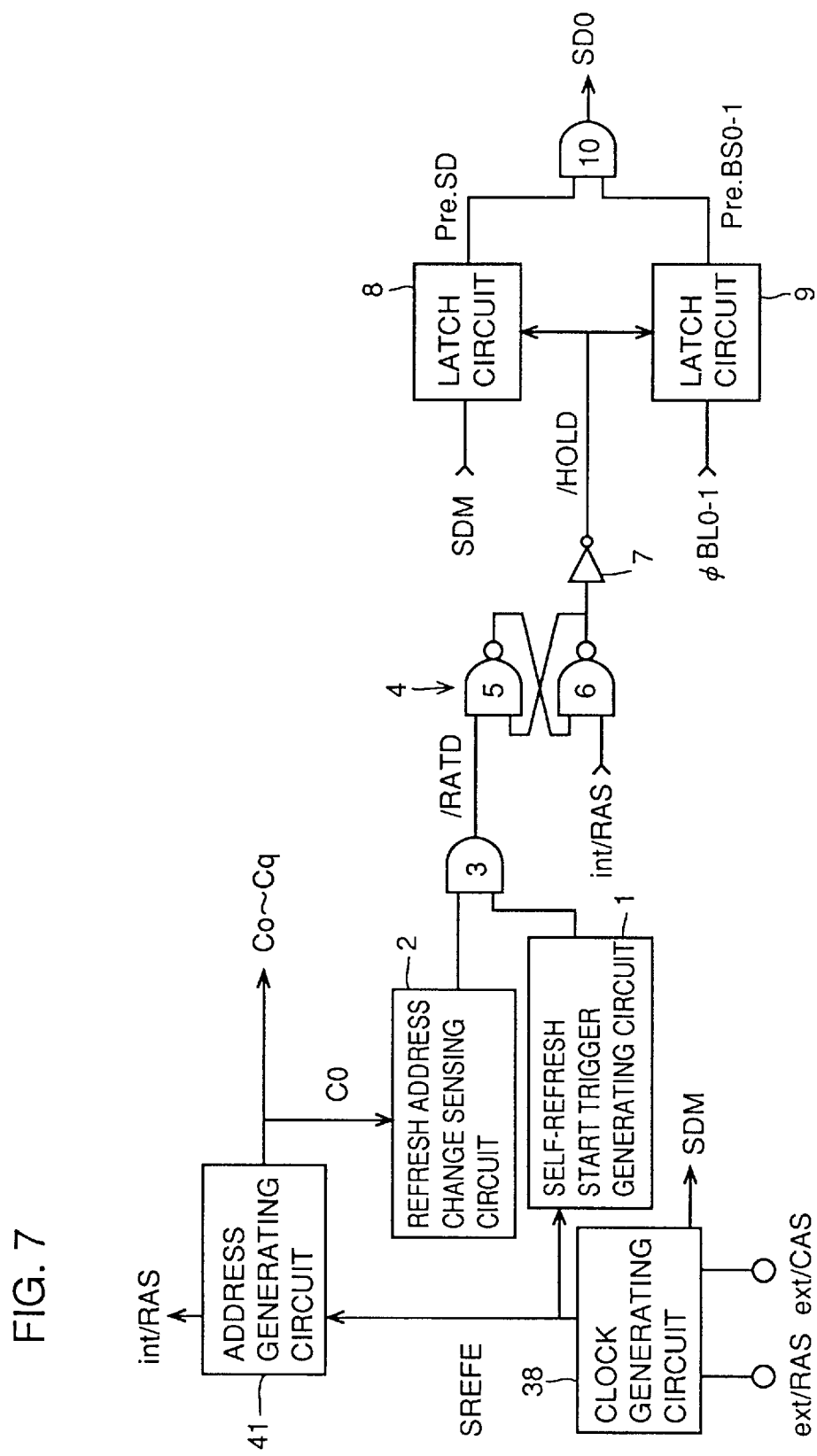
FIG. 7 is a block diagram showing a structure of a main part of the DRAM shown in FIG. 5.
Figure 8:
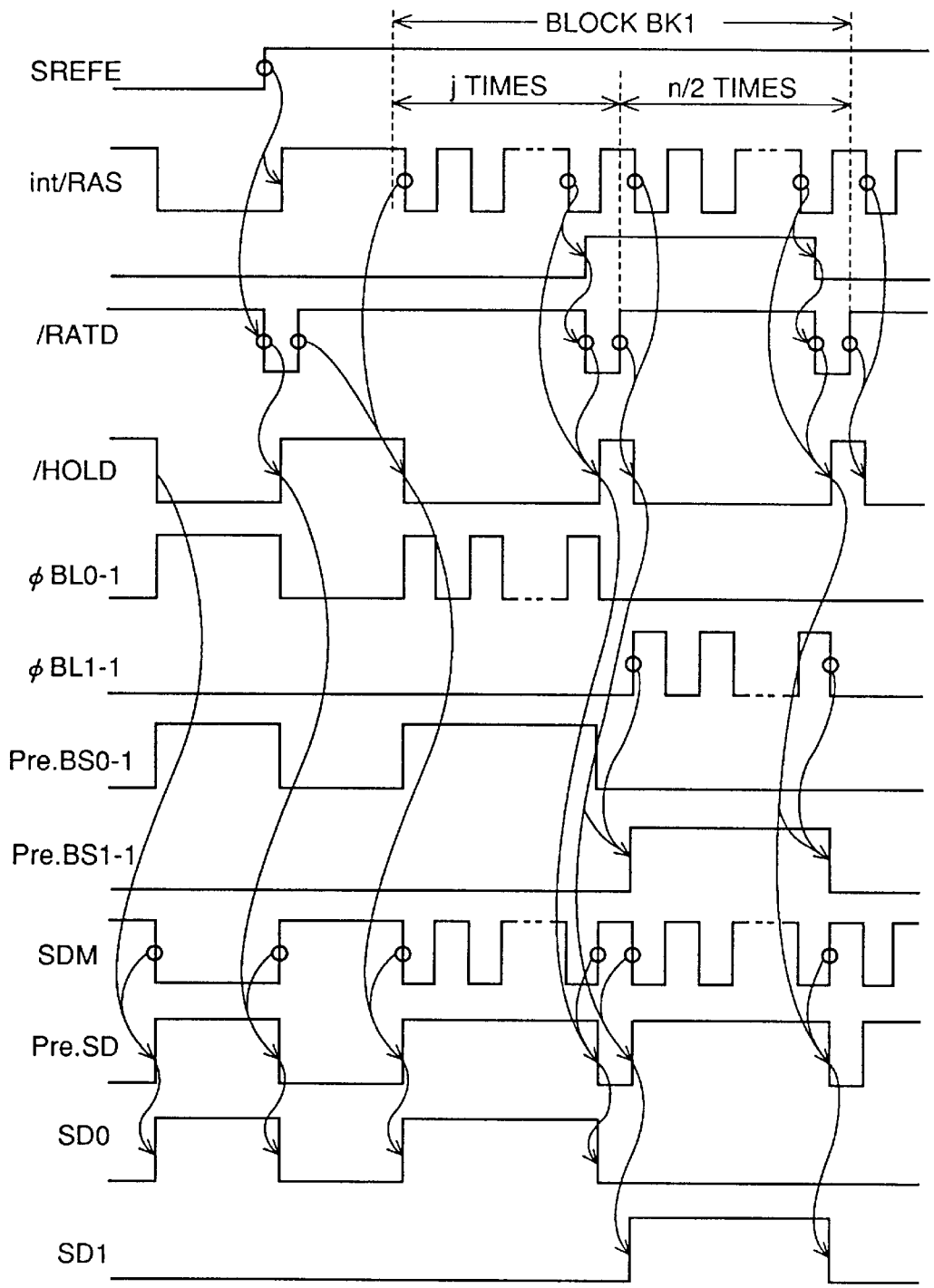
FIG. 8 is a timing chart illustrating the operation of the DRAM shown in FIG. 5.

FIG. 7 is a block diagram showing a circuit for generating a signal SD in the DRAM shown in FIGS. 5 and 6, and FIG. 8 is a timing chart illustrating an operation thereof.

The structure and the operation of the circuit of FIGS. 7 and 8 are the same as those of FIGS. 1 and 4 except for the fact that signals XDM, Pre.SD, SD0 and SD1 are respectively substituted for signals RXM, Pre.RX, RX0-1 and RX1-1. More specifically, signals SD0 and SD1 for selecting ways W0 and W1, respectively, will not be reset while sub-word lines SWLs belonging to respective ways W0 and W1 are selected.

The same effects as those of the first embodiment can be obtained from the second embodiment.

Third Embodiment

Figure 9:
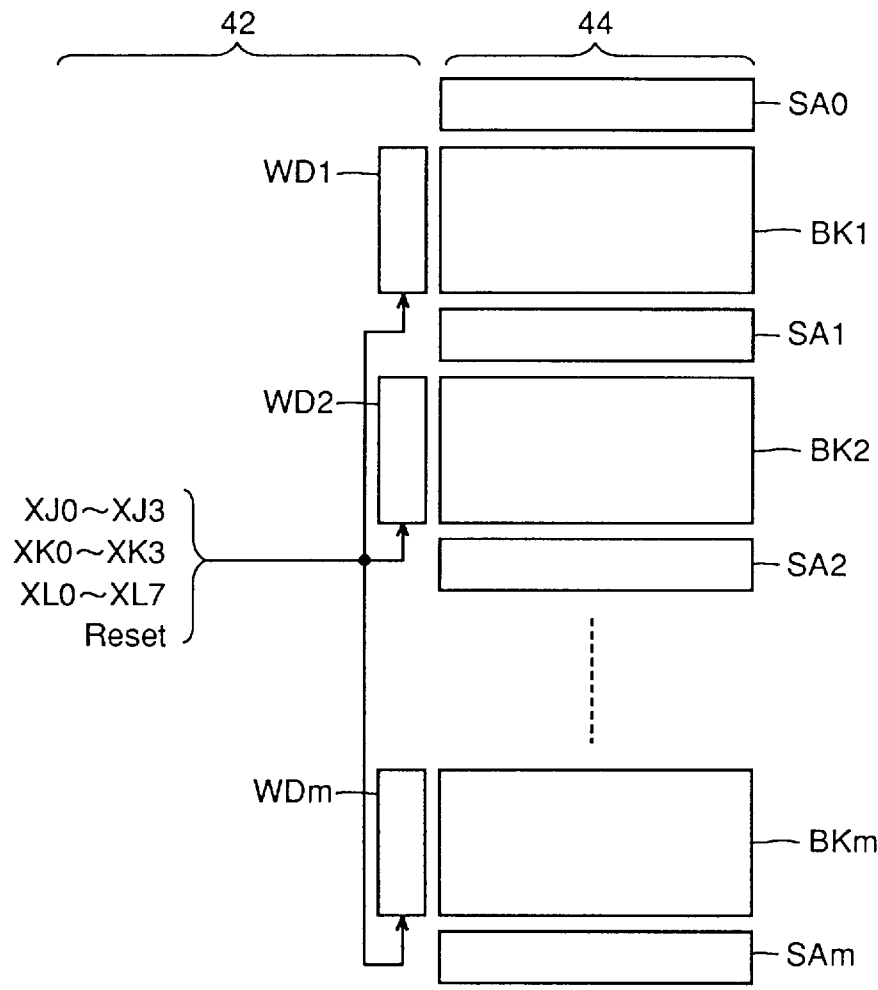
FIG. 9 is a diagram showing layout of a row decoder and a memory mat of a DRAM in accordance with a third embodiment of the present invention.
Figure 10:
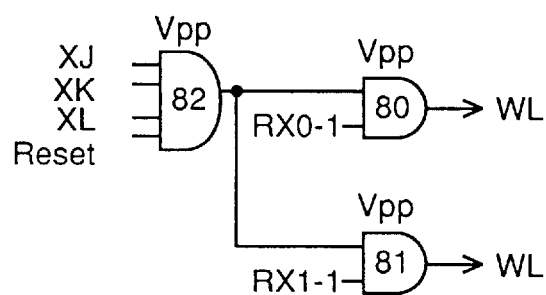
FIG. 10 is a block diagram showing a structure of a word driver shown in FIG. 9.

FIG. 9 is a diagram showing layout of a row decoder 42 and a memory mat 44 of a DRAM in accordance with a third embodiment of the present invention, and FIG. 10 is a block diagram partially showing a structure of a word driver group WD shown in FIG. 9.

Referring to FIG. 9, predecode signal groups XJ, XK, XL, and Reset instead of the signal group X are formed in row decoder 42, and these predecode signal groups XJ, XK, XL, and Reset are applied to each word driver 82.

Figure 11:
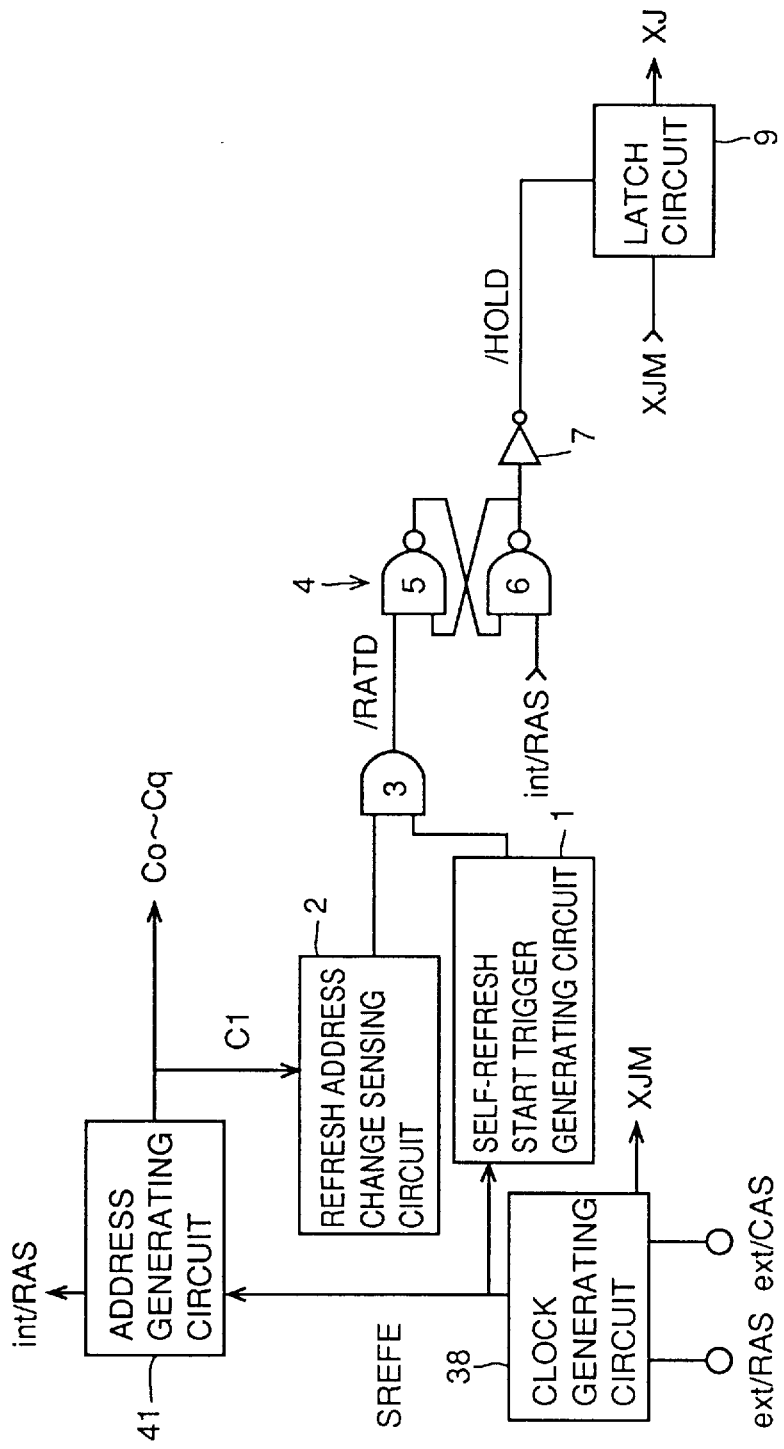
FIG. 11 is a block diagram showing a structure of a main part of a DRAM shown in FIG. 9.
Figure 12:
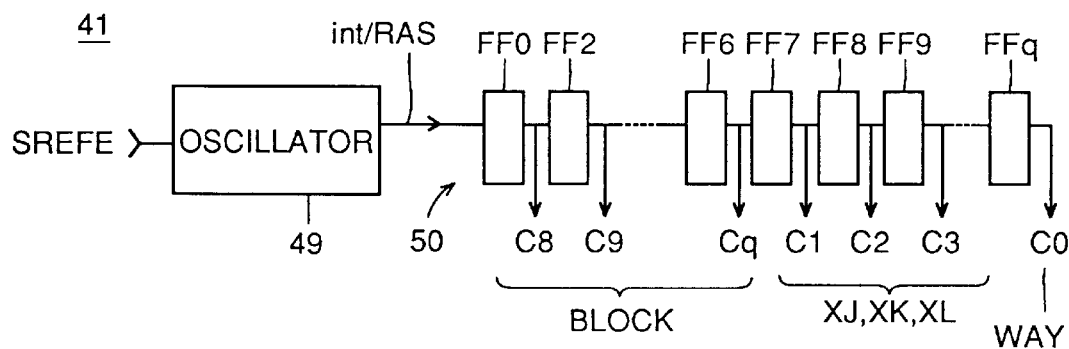
FIG. 12 is a block diagram partially showing a structure of an address generating circuit shown in FIG. 11.

FIG. 11 is a block diagram showing a main part of this DRAM, and FIG. 12 is a block diagram showing a structure of an address generating circuit 41.

Referring to FIGS. 11 and 12, this DRAM is different from that of the first embodiment in that latch circuit 8 and AND gate 10 are removed, and in that address signals C8-Cq relating to selection of a block BK are respectively output from flipflops FF0–FF6 of address generating circuit 41, address signals C1–C7 relating to predecode signals XJ, XK and XL are respectively output from flipflops FF7-FFq-1, and a signal relating to selection of a way W is output from a flipflop FFq. A refresh address change sensing circuit 2 outputs a pulse signal in response to change in an address signal C1, that is, an output of flipflop FF7 of address generating circuit 41. A signal XJM is input to a latch circuit 9, and an output of latch circuit 9 is a signal XJ. Latch circuit 9 is provided corresponding to each of predecode signals XJ, XK, XL, and Reset.

Figure 13:
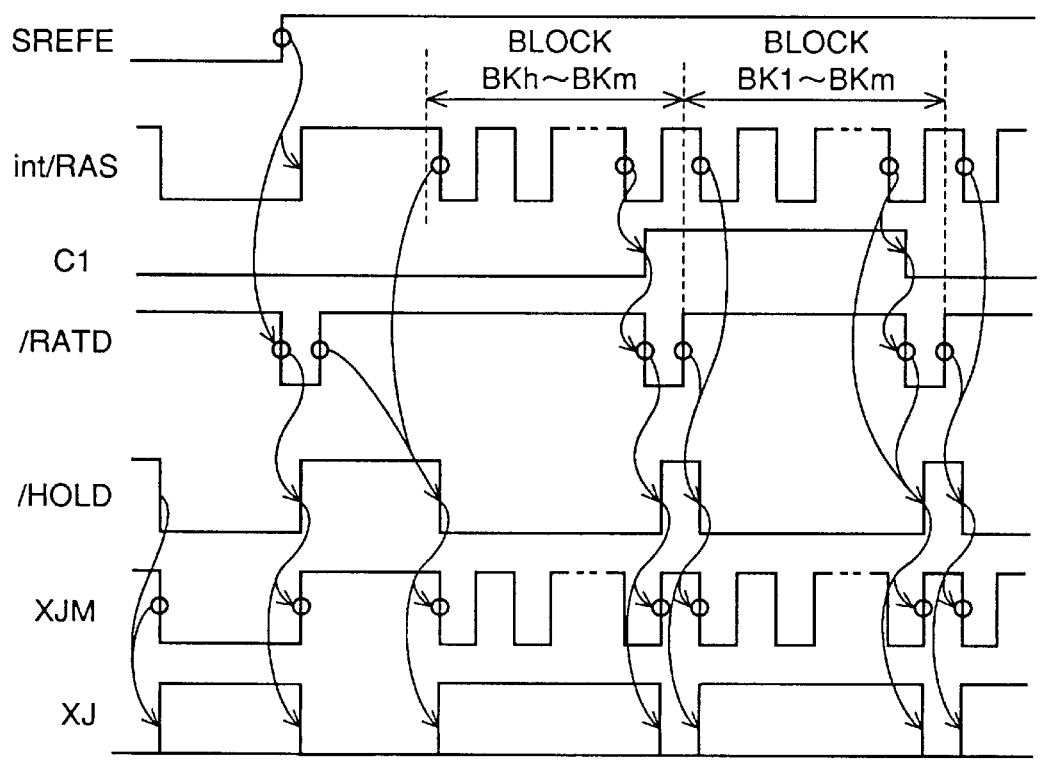
FIG. 13 is a timing chart illustrating the operation of the DRAM shown in FIG. 9.

FIG. 13 is a timing chart illustrating the operation of the DRAM shown in FIGS. 9–12. A signal /HOLD is generated in a manner similar to that of the first embodiment. A signal XJM is latched by latch circuit 9 when the signal /HOLD falls from an "H" level to an "L" level, and is unlatched from latch circuit 9 when the signal /HOLD rises from an "L" level to an "H" level. An output of latch circuit 9 is a signal XJ. The same is applied to other signals XK, XL, and Reset.

While two word drivers 80 and 81 in each of blocks BK1-BKm are activated by predecode signals XJ, XK, XL, and Reset, signals RX0-1 to RX0-m or signals RX1-1 to RX1-m attain an "H" level sequentially, and corresponding word lines WLs in respective blocks BK1 to BKm are selected sequentially, so that data refresh is carried out. At the time of start of refresh, while two word drivers 80 and 81 in each of blocks BK1 to BKm are activated by predecode signals XJ, XK, XL, and Reset, signals RX0-h (where h≧1) to RX0-m or signal RXh-1 to RX1-m attain an "H" level sequentially and corresponding word line WL in respective blocks BKh to BKm are selected sequentially, so that data refresh is carried out.

In the third embodiment, a lower address is assigned to each of blocks BK1 to BKm, and an upper address is assigned to each word line WL belonging to blocks BK1 to BKm, and further, predecode signals XJ, XK, XL, and Reset will not be reset while corresponding word lines WLs in respective blocks BK1 to BKm are selected. Consequently, power consumption can be reduced compared to a conventional example in which predecode signals XJ, XK, XL, and Reset are reset every time a single word line WL is selected.

Fourth Embodiment

Figure 14:
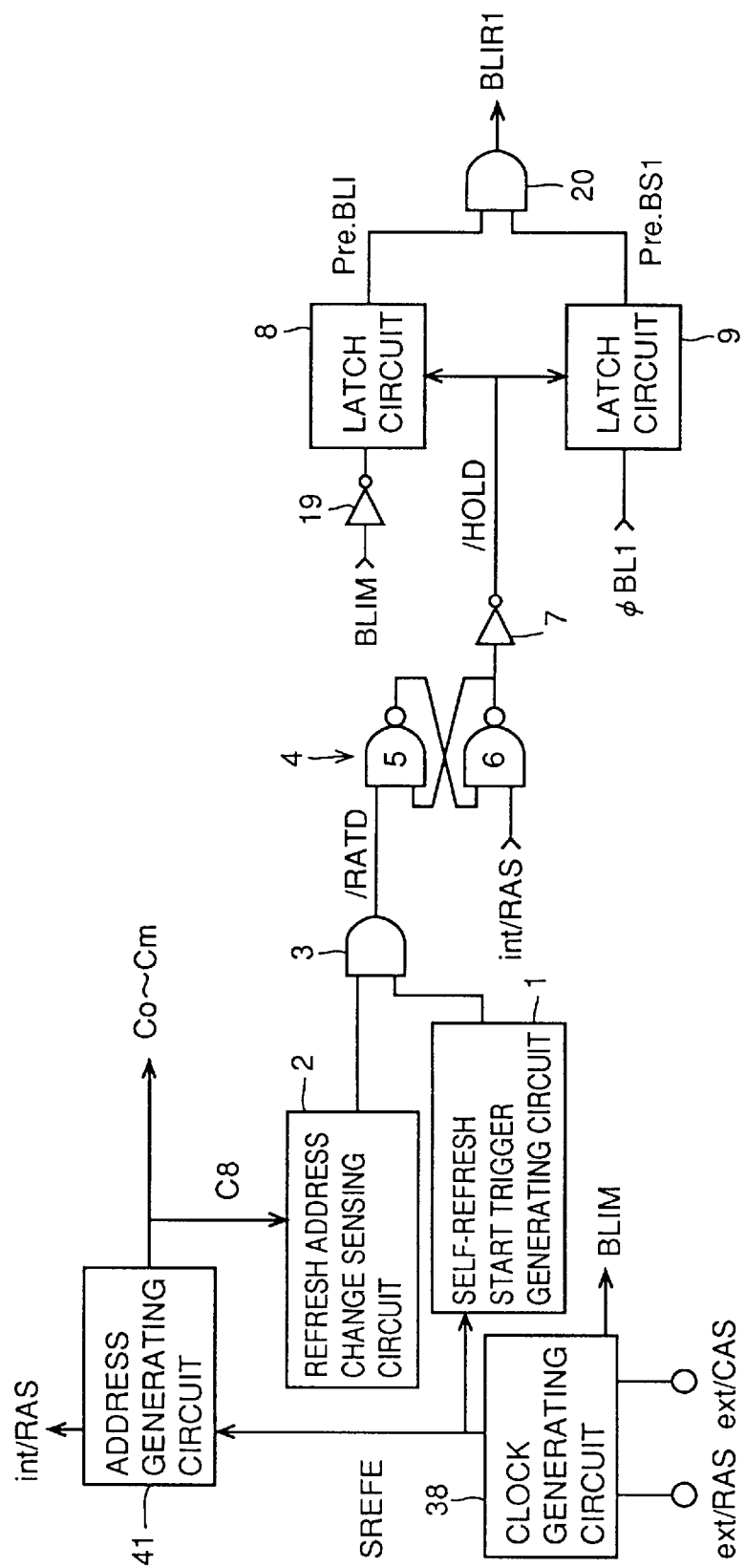
FIG. 14 is a block diagram showing a structure of a main part of a DRAM in accordance with a fourth embodiment of the present invention.

FIG. 14 is a block diagram showing a structure of a main part of a DRAM in accordance with a fourth embodiment of the present invention.

Referring to FIG. 14, this DRAM is different from a conventional one in that a row decoder 42 is additionally provided with a self-refresh start trigger generating circuit 1, a refresh address change sensing circuit 2, an AND gate 3, a flipflop 4, latch circuits 8 and 9, an inverter 19 and an NAND gate 20. Refresh address change sensing circuit 2 normally outputs a signal at an "H" level, and outputs a pulse at an "L" level in response to change in an address signal C8, that is, an output of a flipflop FF8 in an address generating circuit 41. A signal BLIM is input through inverter 19 to latch circuit 8, and a block selection signal ΦBL1 is input to latch circuit 9. NAND gate 20 receives an output signal Pre.BLI of latch circuit 8 and an output signal Pre.BS1 of latch circuit 9, and outputs a signal BLIR1. Self-refresh start trigger generating circuit 1, AND gate 3, flipflop 4, and latch circuits 8 and 9 are the same as those described in connection with FIG. 1. Latch circuit 9 and NAND gate 20 are provided corresponding to each of signals BLIL1, BLIR1, BLIL2, RLIR2, . . . Signals ΦBL2, ΦBL1, ΦBL3, ΦBL2, . . . for selecting a block to which corresponding signals BLIL1, BLIR1, BLIL2, BLIR2, . . . are related, respectively, are input to latch circuit 9.

Figure 15:
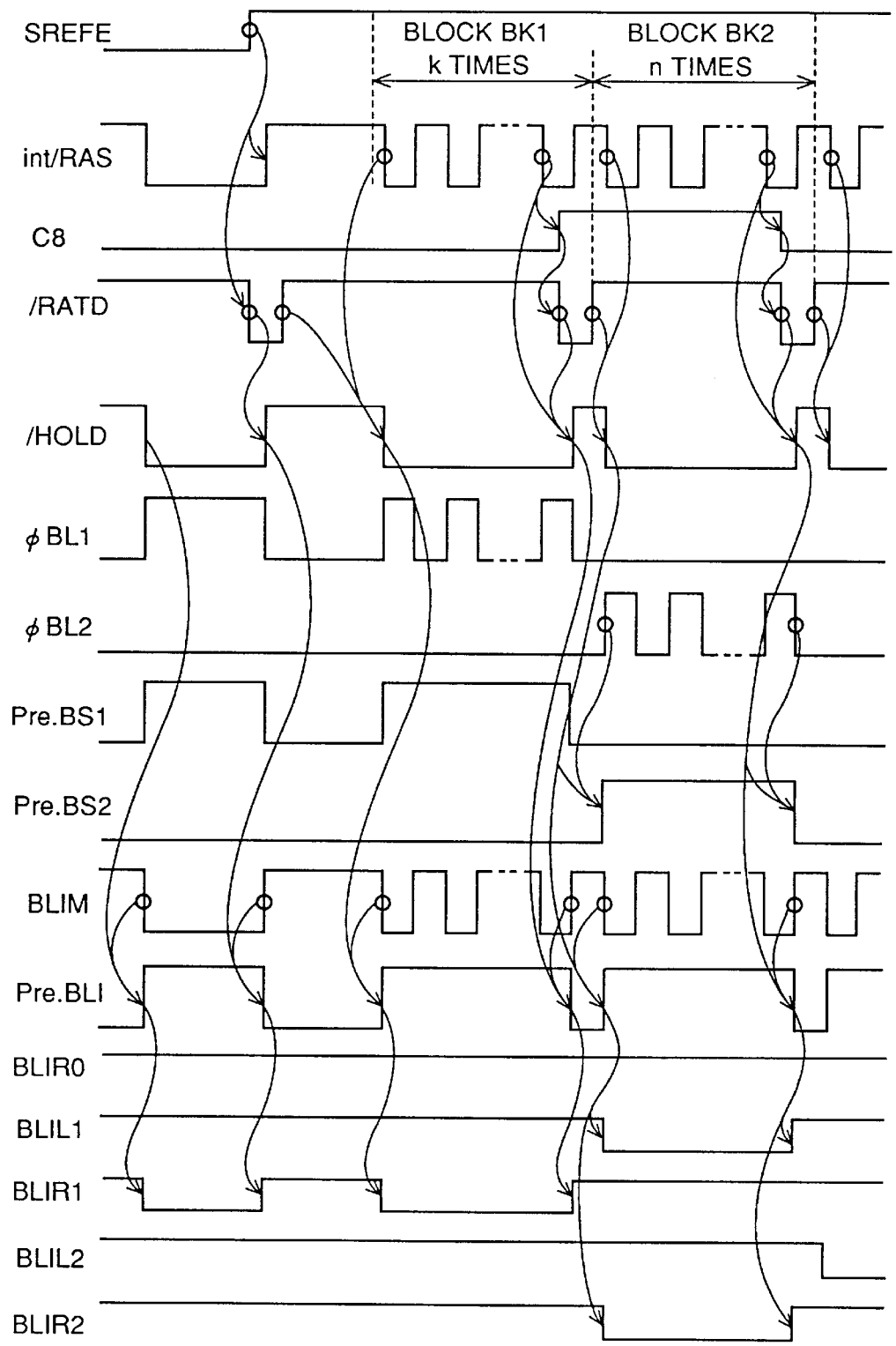
FIG. 15 is a timing chart illustrating the operation of the DRAM shown in FIG. 14.
Figure 16:
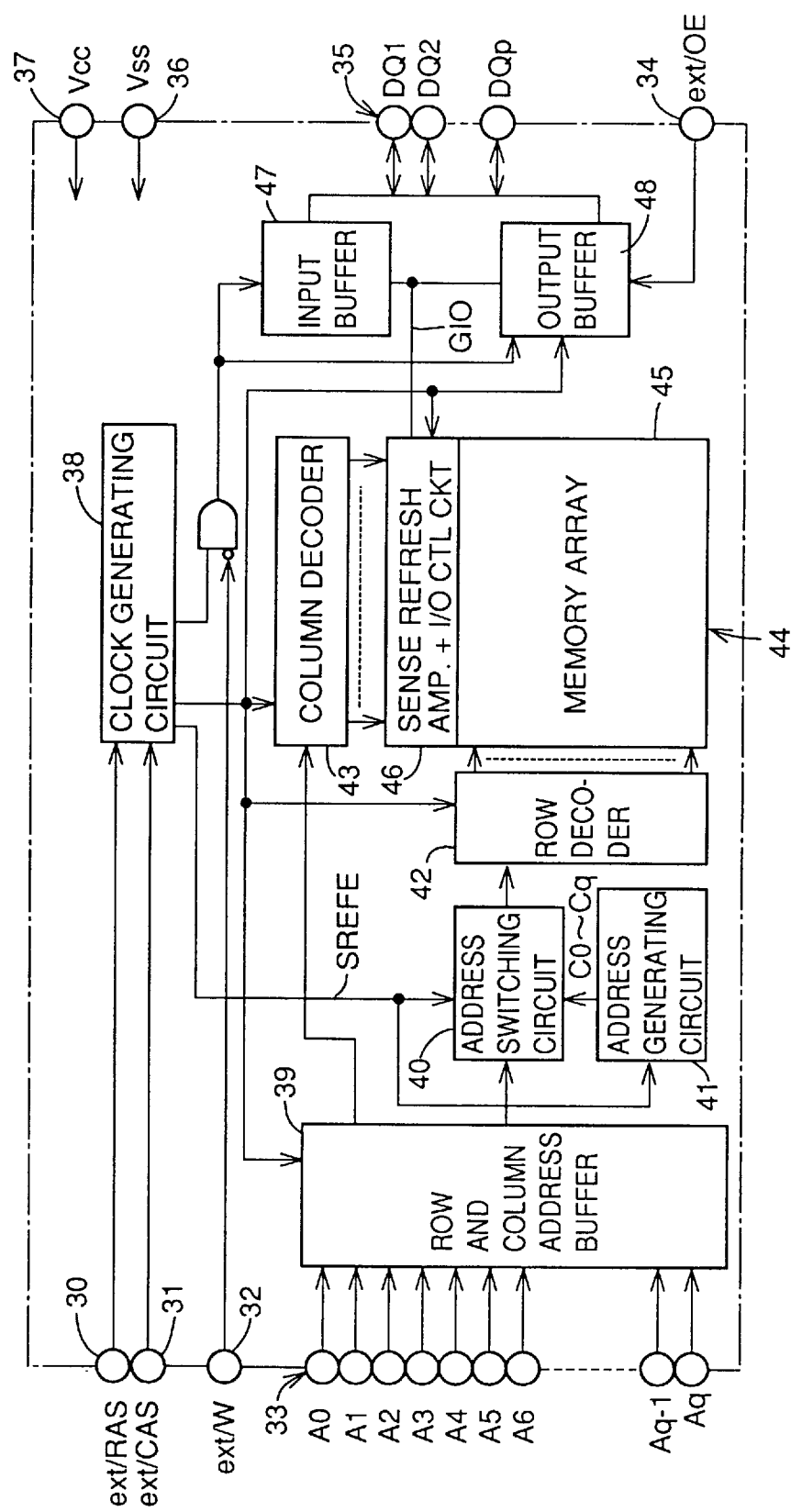
FIG. 16 is a block diagram showing a structure of a conventional DRAM.
Figure 17:
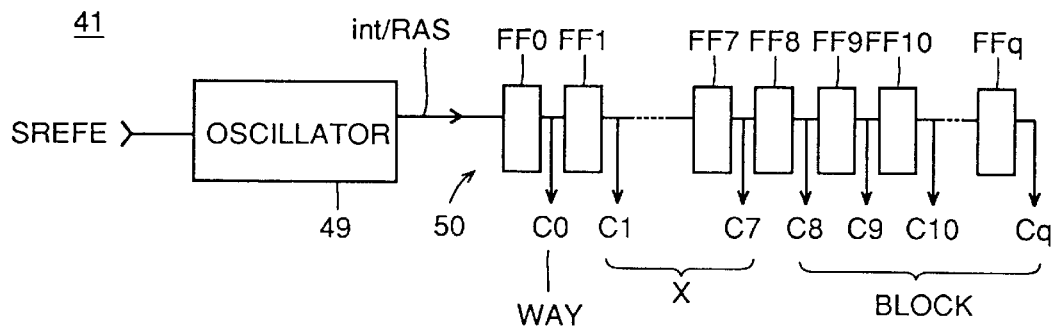
FIG. 17 is a block diagram partially showing a structure of an address generating circuit shown in FIG. 16.
Figure 18:
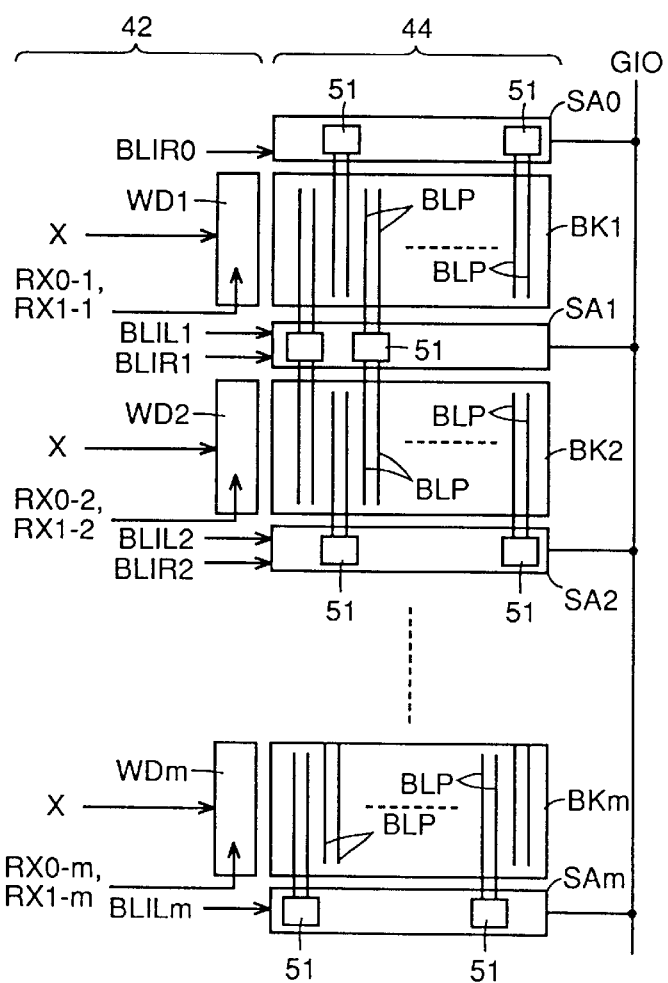
FIG. 18 is a diagram partially showing layout of a row decoder and a memory mat shown in FIG. 16.

FIG. 15 is a timing chart illustrating the operation of the DRAM shown in FIG. 14. A signal /HOLD is generated in a manner similar to that in the first embodiment. Signals ΦBL1 and ΦBL2 are inverted signals of an internal clock signal int/RAS for a period during which blocks BK1 and BK2 are selected, respectively. Signals Pre.BS1 and Pre.BS2 are signals resulting from latch of signals ΦBL1 and ΦBL2 by latch circuit 9, respectively. Signals Pre.BS1 and Pre.BS2 are signals resulting from the fact that portions of signals ΦBL1 and ΦBL2, which are inverted signals of the internal clock signal int/RAS, are made constant at an "H" level, respectively. A signal BLIM swings at approximately the same timing as that of the internal clock signal int/RAS, and is output from a clock generating circuit 38. A signal Pre.BLI is a signal resulting from latch of an inverted signal of the signal BLIM by latch circuit 8.

A signal BLIR0 is at an "H" level at all times. Each of signals BLIL1 and BLIR2 is an inverted signal of a logical product signal of signals Pre.BS2 and Pre.BLI, and therefore, is normally at an "H" level, and is at an "L" level while a block BK2 is selected. A signal BLIR1 is an inverted signal of a logical product signal of signals Pre.BS1 and Pre.BLI, therefore, is normally at an "H" level, and is at an "L" level while a block BK1 is selected.

While the signal BLIR1 is at an "L" level, each word line WL of block BK1 is sequentially selected, so that data refresh is carried out. While the signals BLIL1 and BLIR2 are at an "L" level, each word line WL of block BK2 is sequentially selected, so that data refresh is carried out. Then, a block BK3 is selected and similar operation is performed.

In the present embodiment, while one block BK (BK2, for example) is selected, a signal BLI (BLIL1 and BLIR2, in this case) will not be reset and held at an active level of an "L" level. Consequently, power consumption is reduced compared to a conventional example in which a signal BLI is reset every time a single word line WL is selected.

It is noted that power consumption can be further reduced if the present embodiment is combined with any one of the first to the third embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a self-refresh mode, comprising:
   a memory array including a plurality of memory cells arranged in rows and columns, a plurality of word lines divided into a plurality of groups and each provided corresponding to each row, and a bit line pair provided corresponding to each column, wherein, in said self-refresh mode, an upper address is assigned to each group and a lower address is assigned to each word line in each group;
   address designating means responsive to said self-refresh mode for sequentially designating each lower address belonging to one upper address of said memory array and then sequentially designating each lower address belonging to another upper address;
   first signal generating means provided corresponding to each upper address for outputting a group selection signal for selecting a corresponding group in response to start of designation of a corresponding upper address by said address designating means and discontinuing output of the group selection signal in response to finish of the designation;
   second signal generating means provided corresponding to each lower address for outputting a word line selection signal for selecting a corresponding word line in response to start of designation of a corresponding lower address by said address designating means and discontinuing output of the word line selection signal in response to finish of the designation;
   word line driving means provided corresponding to each word line for rendering a corresponding word line at an active level in response to both output of said group selection signal from corresponding first signal generating means and output of said word line selection signal from corresponding second signal generating means; and
   refresh executing means for carrying out data refresh of memory cells corresponding to a word line which is rendered at an active level by said word line driving means.

2. The semiconductor memory device in accordance with claim 1, wherein
   said address designating means includes clock generating means responsive to said self-refresh mode for outputting a clock signal, a first counter for counting a number of pulses of the clock signal output from said clock generating means and sequentially designating said lower address according to a first resultant count value, and a second counter for counting a number of times for said first counter to count up and sequentially designating said upper address according to a second resultant count value.

3. The semiconductor memory device in accordance with claim 2, wherein said first signal generating means includes first pulse generating means responsive to said self-refresh mode for outputting a first pulse signal, second pulse generating means responsive to change in the count value of said second counter for outputting a second pulse signal, a flipflop which is set by the first and the second pulse signals respectively output from said first and said second pulse generating means and is reset by the clock signal output from said clock generating means, and output means for outputting said group selection signal in response to both start of designation of a corresponding upper address by said second counter and reset of said flipflop and discontinuing output of the group selection signal in response to set of said flipflop.

4. A semiconductor memory device having a self-refresh mode, comprising:

a memory array including a plurality of blocks each having a plurality of memory cells arranged in rows and columns, a word line provided corresponding to each row, and a bit line pair provided corresponding to each column, wherein, in said self-refresh mode, a lower address is assigned to each block and an upper address is assigned to each word line belonging to each block;

address designating means responsive to said self-refresh mode for sequentially designating each lower address belonging to one upper address of said memory array and then sequentially designating each lower address belonging to another upper address;

first signal generating means provided corresponding to each upper address for outputting a word line selection signal for selecting a corresponding word line in response to start of designation of a corresponding upper address by said address designating means and discontinuing output of the word line selection signal in response to finish of the designation;

second signal generating means provided corresponding to each lower address for outputting a block selection signal for selecting a corresponding block in response to start of designation of a corresponding lower address by said address designating means and discontinuing output of the block selection signal in response to finish of the designation;

word line driving means provided corresponding to each word line for rendering a corresponding word line at an active level in response to both output of said word line selection signal from corresponding first signal generating means and output of said block selection signal from corresponding second signal generating means; and refresh executing means for carrying out data refresh of memory cells corresponding to a word line which is rendered at an active level by said word line driving means.

5. The semiconductor memory device in accordance with claim 4, wherein said address designating means includes clock generating means responsive to said self-refresh mode for outputting a clock signal, a first counter for counting a number of pulses of the clock signal output from said clock generating means and sequentially designating said lower address according to a first resultant count value, and a second counter for counting a number of times for said first counter to count up and sequentially designating said upper address according to a second resultant count value.

6. The semiconductor memory device in accordance with claim 5, wherein said first signal generating means includes first pulse generating means responsive to said self-refresh mode for outputting a first pulse signal, second pulse generating means responsive to change in the count value of said second counter for outputting a second pulse signal, a flipflop which is set by the first and the second pulse signals respectively output from said first and said second pulse generating means and is reset by the clock signal output from said clock generating means, and output means for outputting said word line selection signal in response to both start of designation of a corresponding upper address by said second counter and reset of said flipflop and discontinuing output of the word line selection signal in response to set of said flipflop.

7. A semiconductor memory device having a self-refresh mode, comprising:

a memory array including a plurality of blocks each having a plurality of memory cells arranged in rows and columns, a word line corresponding to each row, and a bit line pair provided corresponding to each column, wherein, in said self-refresh mode, an upper address is assigned to each block and a lower address is assigned to each word line belonging to each block;

refresh executing means provided between every two of said plurality of blocks of said memory array for carrying out data refresh of memory cells corresponding to a word line rendered at an active level in an adjacent block;

address designating means responsive to said self-refresh mode for sequentially designating each lower address belonging to one upper address of said memory array and then sequentially designating each lower address belonging to another upper address;

first signal generating means provided corresponding to each upper address for outputting a block selection signal for selecting a corresponding block in response to start of designation of a corresponding upper address by said address designating means and discontinuing output of the block selection signal in response to finish of the designation;

second signal generating means provided corresponding to each lower address for outputting a word line selection signal for selecting a corresponding word line in response to start of designation of a corresponding lower address by said address designating means and discontinuing output of the word line selection signal in response to finish of the designation;

connection means provided corresponding to each block for connecting a corresponding block to corresponding refresh executing means as well as disconnecting another block from the refresh executing means in response to output of said block selection signal from corresponding first signal generating means; and word line driving means provided corresponding to each word line for rendering a corresponding word line at said active level in response to both output of said block selection signal from corresponding first signal generating means and output of said word line selection signal from corresponding second signal generating means.

8. The semiconductor memory device in accordance with claim 7, wherein said address designating means includes clock generating means responsive to said self-refresh mode for outputting a clock signal, a first counter for counting a number of pulses of the clock signal output from said clock generating means and sequentially designating said lower address according to a first resultant count value, and a second counter for counting a number of times for said first counter to count up and sequentially designating said upper address according to a second resultant count value.

9. The semiconductor memory device in accordance with claim 8, wherein said first signal generating means includes first pulse generating means responsive to said self-refresh mode for outputting a first pulse signal, second pulse generating means responsive to change in the count value of said second counter for outputting a second pulse signal, a flipflop which is set by the first and the second pulse signals respectively output from said first and said second pulse generating means and is reset by the clock signal output from said clock generating means, and output means for outputting said block selection signal in response to both start of designation of a corresponding upper address by said second counter and reset of said flipflop and discontinuing output of the block selection signal in response to set of said flipflop.

10. A semiconductor memory device having a self-refresh mode, comprising:

a memory array including a plurality of blocks each having a plurality of memory cells arranged in rows and columns, a word line corresponding to each row, and a bit line pair provided corresponding to each column, with said plurality of blocks arranged in a direction in which said bit line pair extends, wherein, in said self-refresh mode, an upper address is assigned to each block and a lower address is assigned to each word line belonging to each block;

first refresh executing means provided to be shared by an odd-numbered bit line pair of one block of said memory array and an odd-numbered bit line pair of a block adjacent to one side of said one block, for carrying out data refresh of a memory cell corresponding to a word line rendered at an active level in a selected block;

second refresh executing means provided to be shared by an even-numbered bit line pair of said one block and an even-numbered bit line pair of a block adjacent to the other side of said one block, for carrying out data refresh of a memory cell corresponding to a word line rendered at an active level in a selected block;

address designating means responsive to said self-refresh mode for sequentially designating each lower address belonging to one upper address of said memory array and then sequentially designating each lower address belonging to another upper address;

first signal generating means provided corresponding to each upper address for outputting a block selection signal for selecting a corresponding block in response to start of designation of a corresponding upper address by said address designating means and discontinuing output of the block selection signal in response to finish of the designation;

second signal generating means provided corresponding to each lower address for outputting a word line selection signal for selecting a corresponding word line in response to start of designation of a corresponding lower address by said address designating means and discontinuing output of the word line selection signal in response to finish of the designation;

connection means provided corresponding to each block for connecting bit line pairs belonging to a corresponding block to corresponding first and second refresh executing means as well as disconnecting bit line pairs belonging to another block from said first and second refresh executing means in response to output of said block selection signal from corresponding first signal generating means; and word line driving means provided corresponding to each word line for rendering a corresponding word line at said active level in response to both output of said block selection signal from corresponding first signal generating means and output of said word line selection signal from corresponding second signal generating means.

11. The semiconductor memory device in accordance with claim 10, wherein said address designating means includes clock generating means responsive to said self-refresh mode for outputting a clock signal, a first counter for counting a number of pulses of the clock signal output from said clock generating means and sequentially designating said lower address according to a first resultant count value, and a second counter for counting a number of times for said first counter to count up and sequentially designating said upper address according to a second resultant count value.

12. The semiconductor memory device in accordance with claim 10, wherein said first signal generating means includes first pulse generating means responsive to said self-refresh mode for outputting a first pulse signal, second pulse generating means responsive to change in the count value of said second counter for outputting a second pulse signal, a flipflop which is set by the first and the second pulse signals respectively output from said first and said second pulse generating means and is reset by the clock signal output from said clock generating means, and output means for outputting said block selection signal in response to both start of designation of a corresponding upper address by said second counter and reset of said flipflop and discontinuing output of the block selection signal in response to set of said flipflop.

* * * * *